United States Patent
Yazaki et al.

(10) Patent No.: US 9,022,533 B2
(45) Date of Patent: May 5, 2015

(54) LIQUID EJECTING HEAD, LIQUID EJECTING APPARATUS, PIEZOELECTRIC ELEMENT, AND METHOD FOR MANUFACTURING PIEZOELECTRIC ELEMENT

(71) Applicant: Seiko Epson Corporation, Tokyo (JP)

(72) Inventors: Shiro Yazaki, Chino (JP); Takahiro Kamijo, Matsumoto (JP); Toshihiro Shimizu, Fujimi-machi (JP); Motoki Takabe, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/202,886

(22) Filed: Mar. 10, 2014

(65) Prior Publication Data
US 2014/0267511 A1    Sep. 18, 2014

(30) Foreign Application Priority Data

Mar. 13, 2013   (JP) .................................. 2013-050103

(51) Int. Cl.
| | |
|---|---|
| B41J 2/045 | (2006.01) |
| H01L 41/047 | (2006.01) |
| B41J 2/055 | (2006.01) |
| B41J 2/14 | (2006.01) |
| B41J 2/16 | (2006.01) |
| H01L 41/08 | (2006.01) |
| H01L 41/09 | (2006.01) |
| H01L 41/187 | (2006.01) |
| H01L 41/318 | (2013.01) |

(52) U.S. Cl.
CPC ............... *H01L 41/047* (2013.01); *B41J 2/055* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1645* (2013.01); *B41J 2/1646* (2013.01); *B41J 2002/14241* (2013.01); *B41J 2002/14491* (2013.01); *H01L 41/0477* (2013.01); *H01L 41/081* (2013.01); *H01L 41/0973* (2013.01); *H01L 41/1876* (2013.01); *H01L 41/318* (2013.01)

(58) Field of Classification Search
None
See application file for complete search history.

(56) References Cited

U.S. PATENT DOCUMENTS

| | | | |
|---|---|---|---|
| 2006/0290747 A1* | 12/2006 | Shimada et al. ................. | 347/68 |
| 2009/0284568 A1 | 11/2009 | Yazaki | |

FOREIGN PATENT DOCUMENTS

| | | |
|---|---|---|
| JP | 2009-172878 | 8/2009 |
| JP | 2010199290 A * | 9/2010 |

* cited by examiner

*Primary Examiner* — Matthew Luu
*Assistant Examiner* — Erica Lin
(74) *Attorney, Agent, or Firm* — Workman Nydegger

(57) ABSTRACT

A flow channel substrate includes pressure chambers, and the pressure chambers communicate with nozzle openings. Piezoelectric elements located on either side of the flow channel substrate include a first electrode, a piezoelectric layer, and a second electrode. The piezoelectric layer contains lead, titanium, and zirconium. The second electrode includes a first layer on the piezoelectric layer side and a second layer on the side of the first layer opposite the piezoelectric layer. The second electrode also includes projections. The projections are aggregates of the lead originating in the piezoelectric layer, and the projections stick out of the surface of the second electrode opposite the piezoelectric layer.

7 Claims, 10 Drawing Sheets

LIQUID EJECTING HEAD, LIQUID EJECTING APPARATUS, PIEZOELECTRIC ELEMENT, AND METHOD FOR MANUFACTURING PIEZOELECTRIC ELEMENT

This application claims the benefit of Japanese Application No. 2013-050103 filed on Mar. 13, 2013. This application is incorporated by reference in its entirety.

BACKGROUND

1. Technical Field

Embodiments of the present invention relate to a liquid ejecting head and a liquid ejecting apparatus that both eject liquid through nozzle openings. Embodiments further relate to a piezoelectric element for liquid ejecting heads or similar devices and to a method for manufacturing the piezoelectric element.

2. Related Art

A known liquid ejecting head ejects droplets of liquid through nozzles by deforming piezoelectric elements to change the pressure of the liquid in pressure chambers that communicate with the nozzles. A representative example is an ink jet recording head, which ejects droplets of ink.

A typical ink jet recording head has piezoelectric elements on either side of a flow channel substrate. The flow channel substrate has pressure chambers that communicate with nozzle openings. The piezoelectric elements operate to deform diaphragms and change the pressure in the pressure chambers. As a result, droplets of the ink are ejected through a nozzle.

A typical piezoelectric element for ink jet recording heads has a first electrode, a piezoelectric layer, and a second electrode. The piezoelectric element is disposed on a diaphragm. The piezoelectric layer is made of, for example, lead zirconate titanate (PZT) (e.g., see JP-A-2009-172878). There is a risk that this type of piezoelectric element for ink jet recording heads will break because excessive lead in the piezoelectric layer lowers the withstand voltage (e.g., the voltage at which the piezoelectric layer breaks or becomes damaged).

Such a problem is not unique to ink jet recording heads. Similar problems may also be encountered in liquid ejecting heads used with liquids other than ink.

SUMMARY

An advantage of some aspects of embodiments of the invention is that they provide a liquid ejecting head, a liquid ejecting apparatus, and a piezoelectric element that all operate with reduced damage to the piezoelectric layer used therein. In other words, embodiments can reduce damage that occurs in piezoelectric layers. A method for manufacturing a piezoelectric element is advantageously provided.

An embodiment of the invention provides a liquid ejecting head that includes a flow channel substrate and a piezoelectric element on either side of the flow channel substrate. The flow channel substrate includes a pressure chamber that communicates with a nozzle opening. The piezoelectric element includes a first electrode, a piezoelectric layer, and a second electrode. The piezoelectric layer may contain lead, titanium, and zirconium. The second electrode may include a first layer on the piezoelectric layer side and a second layer on the side of the first layer opposite the piezoelectric layer. The second electrode may also include projections. The projections are aggregates of the lead originating in the piezoelectric layer. The projections may stick out of the surface of the second electrode opposite the piezoelectric layer.

Embodiments can improve the piezoelectric properties, in particular, the withstand voltage, of the piezoelectric layer through adsorption of an excess of lead from the piezoelectric layer to the first layer. Thus, excessive lead in the piezoelectric layer is removed by adsorption.

The first electrode includes separate electrodes for active sections (practical actuating elements) of the piezoelectric element, and the second electrode serves as a common electrode for the active sections. This structure allows the first electrode to be covered with the piezoelectric layer and eliminates the need for a protection coating that would otherwise be required to reduce the leakage current between first and second electrodes that are close to each other. As a result, a liquid ejecting head is provided that includes a piezoelectric element with excellent displacement properties because the liquid ejecting head has no protective coating that would interfere with displacement of the piezoelectric element.

Another embodiment of the invention provides a liquid ejecting apparatus that includes a liquid ejecting head. The liquid ejecting apparatus offers improved reliability resulting from reduced current-leakage-related damage to the piezoelectric element used therein.

Another aspect of an embodiment of the invention provides a piezoelectric element that includes a first electrode, a piezoelectric layer, and a second electrode. The piezoelectric layer may contain lead, titanium, and zirconium. The second electrode may include a first layer on the piezoelectric layer side and a second layer on the side of the first layer opposite the piezoelectric layer. The second electrode may also include projections. The projections are aggregates of the lead originating in the piezoelectric layer. The projections may stick out of the surface of the second electrode opposite the piezoelectric layer.

Embodiments of the invention improve the piezoelectric properties, in particular, the withstand voltage, of the piezoelectric layer through adsorption of an excess of lead from the piezoelectric layer to the first layer.

Another aspect of an embodiment of the invention provides a method for manufacturing a piezoelectric element that includes a first electrode, a piezoelectric layer, and a second electrode. The piezoelectric layer may contain lead, titanium, and zirconium. The method may include forming a first layer configured for use as or for inclusion in the second electrode on the piezoelectric layer by a gas phase process, for example. The method also includes forming projections from the lead in the piezoelectric layer by patterning and heating the piezoelectric layer and the first layer so that the lead can be adsorbed from the piezoelectric layer to the first layer.

Embodiments of the invention improve the piezoelectric properties, in particular, the withstand voltage, of the piezoelectric layer through adsorption of an excess of lead from the piezoelectric layer to the first layer.

The method may further include, after forming the projections, producing the second electrode by forming a second layer on the first layer. This leads to reduced resistance.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

The following description details embodiments of the invention with reference to the accompanying drawings.

Figure 1:
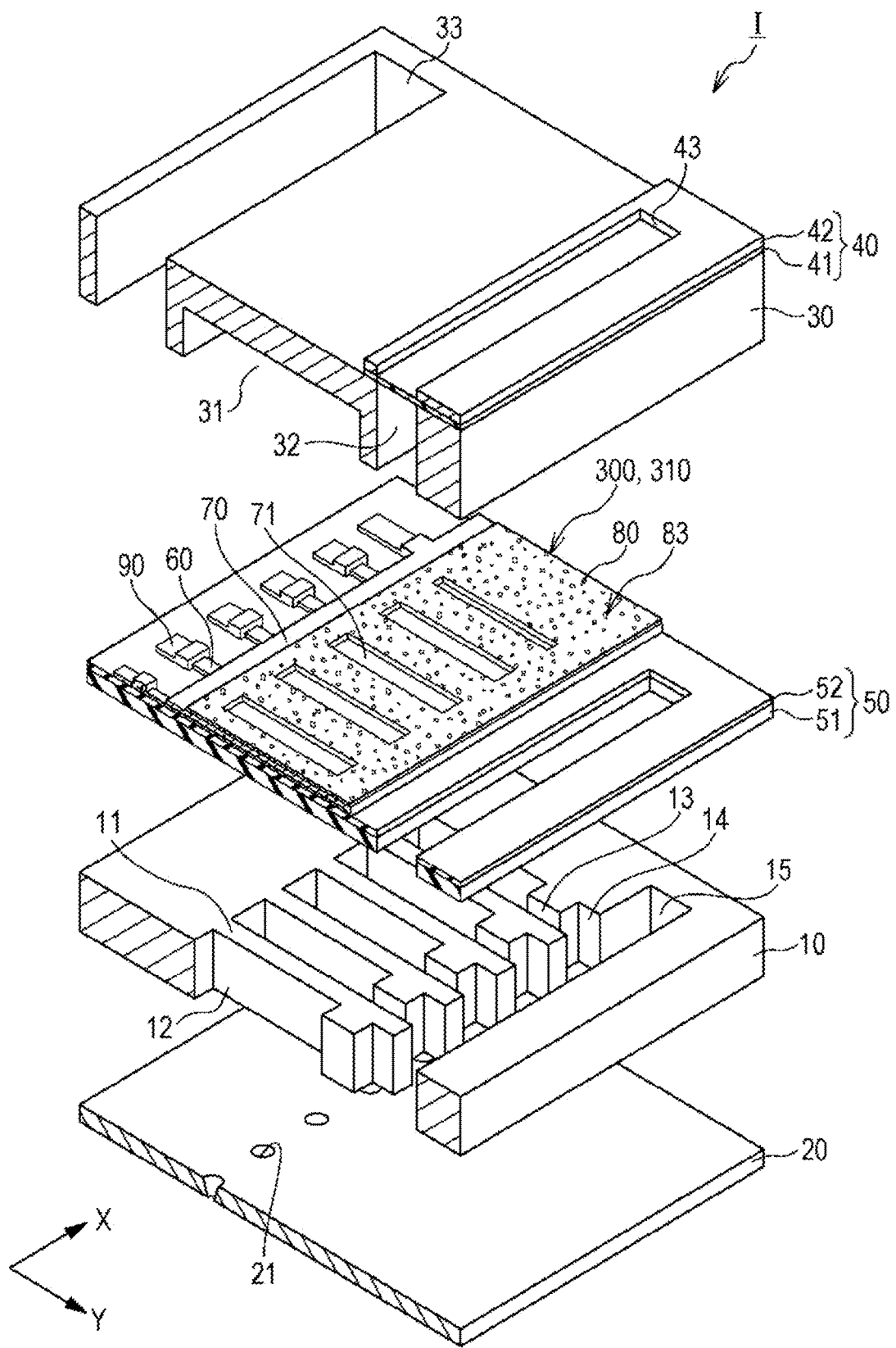
FIG. 1 is an exploded perspective view of an example of a recording head.
Figure 2A:
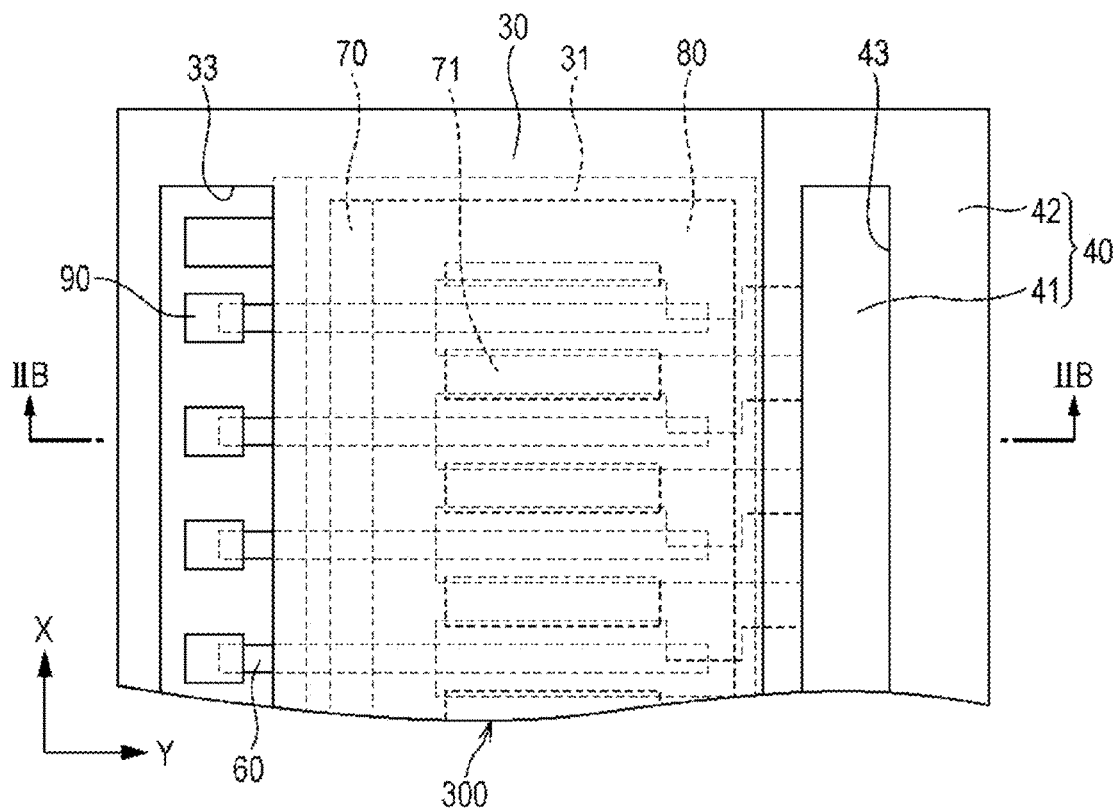
FIGS. 2A and 2B are a plan view and a cross-sectional view, respectively, of the recording head.
Figure 2B:
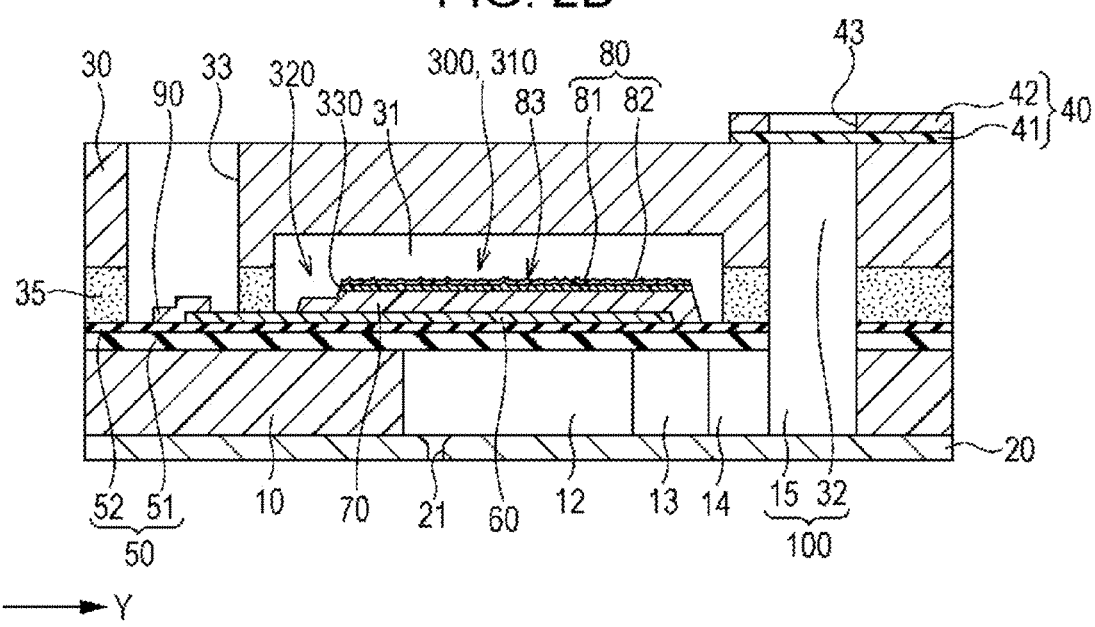
Figure 3A:
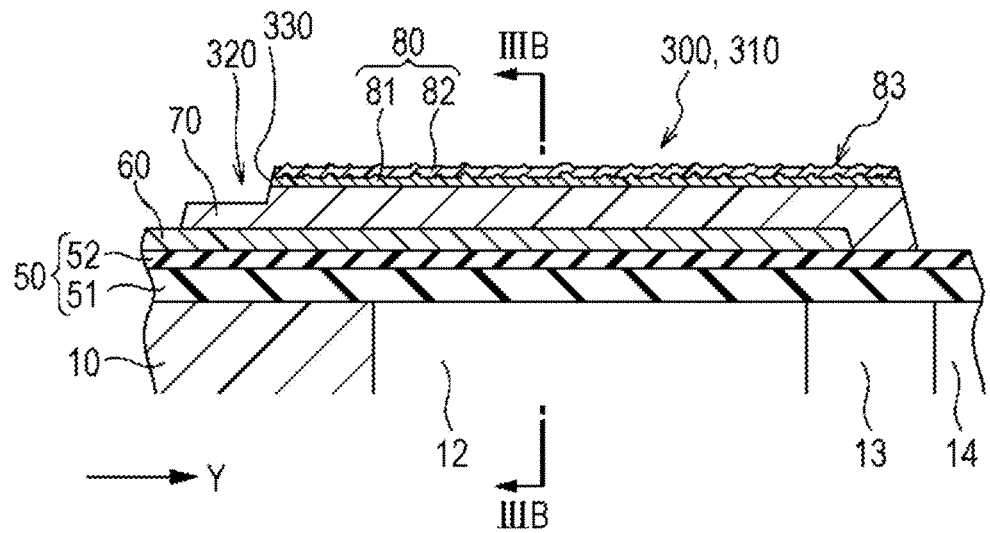
FIGS. 3A and 3B are enlarged cross-sectional views of some essential components of the recording head.
Figure 3B:
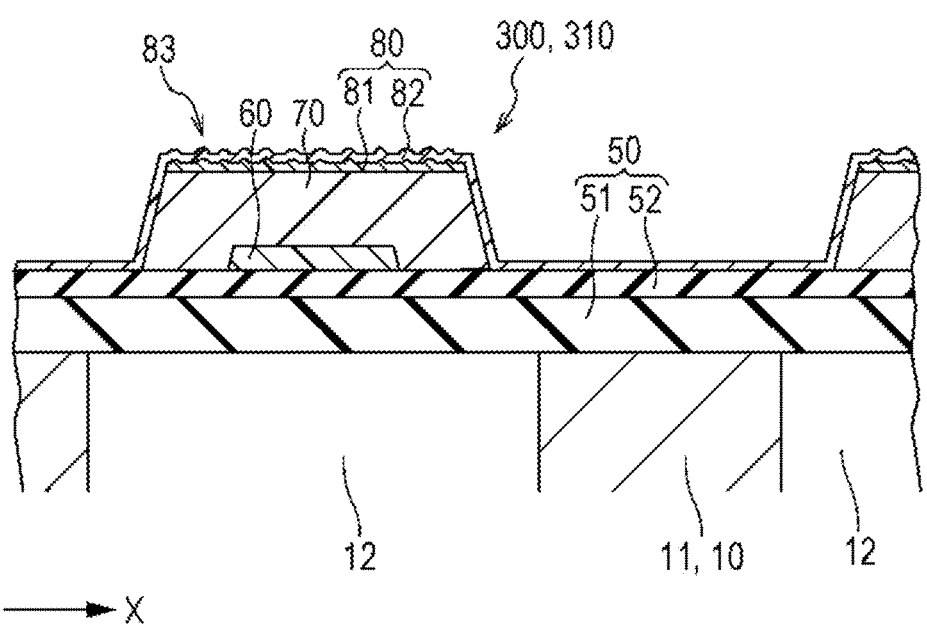

FIG. 1 is a perspective view of an ink jet recording head. The ink jet head is an example of a liquid ejecting head. FIG. 2A is a plan view of the same ink jet recording head, and FIG. 2B is a cross-sectional view taken along line IIB-IIB. FIGS. 3A and 3B are enlarged cross-sectional views of some essential components in FIGS. 2A and 2B.

As illustrated in these drawings, the ink jet recording head I is an example of a liquid ejecting head. The ink jet recording head I includes a flow channel substrate 10 that includes pressure chambers 12. The pressure chambers 12 are defined by several walls 11 and are arranged in the direction of arrangement of several nozzle openings 21 that are configured to eject ink. This direction is hereinafter referred to as the direction of arrangement of the pressure chambers 12 or first direction X. The flow channel substrate 10 may include several rows, two rows in this example, of pressure chambers 12 arranged in first direction X. The pressure chambers 12 are arranged in first direction X in each row, and the direction of arrangement of these rows of pressure chambers 12 is hereinafter referred to as second direction Y.

The flow channel substrate 10 also includes ink supply paths 13 and communicating paths 14 both defined by the walls 11 and located next to either end of the pressure chambers 12 in second direction Y, which is the direction perpendicular to first direction X. Each pressure chamber 12 is associated with a corresponding ink supply path 13 and communicating path 14. The flow channel substrate 10 also includes a communicating space 15 that is a component of a manifold 100. The manifold 100 provides a common ink tank (liquid tank) for the pressure chambers 12, on the outside of the communicating paths 14 (opposite the pressure chambers 12 in the second direction Y). The flow channel substrate 10 therefore has a flow channel made up of the pressure chambers 12, the ink supply paths 13, the communicating paths 14, and the communicating space 15.

A nozzle plate 20 drilled with nozzle openings 21 that communicate with the pressure chambers 12 is bonded with an adhesive agent (e.g., hot-melt film, or a similar material) to either side of the flow channel substrate 10, or more specifically to the side on which the flow channel (the pressure chambers 12 etc.) has openings. The nozzle plate 20 includes nozzle openings 21 arranged in first direction X.

A diaphragm 50 is disposed on the other side of the flow channel substrate 10 relative to the nozzle plate 50. The diaphragm 50 includes an elastic film 51 on the flow channel substrate 10 and an insulating film 52 on the elastic film 51. The flow channel substrate 10 may include a thinned portion that serves as an elastic film for a diaphragm. The flow channel (the pressure chambers 12, etc.) may be created by anisotropically etching the flow channel substrate 10 from either side, and the other side of the flow channel (the pressure chambers 12 etc.) is provided by the diaphragm 50 (elastic film 51).

Piezoelectric elements 300 are disposed on the insulating film 52 and each piezoelectric element includes a first electrode 60, a piezoelectric layer 70, and a second electrode 80. The thickness of these layers is, for example, about 0.2 µm, about 1.0 µm, and about 0.05 µm, respectively. The piezoelectric elements 300, deformably provided to the substrate (flow channel substrate 10), serve as piezoelectric actuators in one embodiment.

The following description describes the piezoelectric elements 300 as piezoelectric actuators in more detail. FIGS. 3A and 3B illustrate cross-sections of piezoelectric elements according to Embodiment 1 of the invention viewed in the first and second directions, respectively.

As illustrated in FIGS. 3A and 3B, the first electrode 60, which is a component of the piezoelectric elements 300, is composed of several pieces that correspond to the individual pressure chambers 12 and that provide separate electrodes for active sections (described hereinafter). Each piece of the first electrode 60 (hereinafter simply referred to as the first electrode 60) is narrower than the pressure chamber 12 in the first direction X of the pressure chamber 12 (FIG. 3B). The ends of the first electrode 60 in the first direction X of the pressure chamber 12 are therefore within the area facing the pressure chamber 12. In second direction Y, the ends of the first electrode 60 are both beyond the edge of the pressure chamber 12 (FIG. 3A). The entire first electrode 60 may be made of a material that is not oxidized and that remains conductive during the formation of the piezoelectric layer (described hereinafter). Examples of suitable conductive materials include noble metals such as platinum (Pt) and iridium (Ir), and conductive oxides such as lanthanum nickel oxide (LNO).

The first electrode 60 may include an adhesion layer that provides sufficient adhesion between the conductive material and the diaphragm 50. An adhesion layer may be made of titanium. Such an adhesion layer can be made of materials such as zirconium, titanium, and titanium oxide. The first electrode 60 may therefore include an adhesion layer made of titanium and a conductive layer made of at least one conductive material selected from conductive materials including those listed above.

The piezoelectric layer 70 is continuous in the first direction X and has a predetermined width in the second direction Y. The width of the piezoelectric layer 70 in second direction Y is larger than the length of the pressure chamber 12 in second direction Y. The piezoelectric layer 70 therefore extends beyond the edge of the pressure chamber 12 in the second direction Y of the pressure chamber 12.

Either end of the piezoelectric layer 70 in the second direction Y of the pressure chamber 12 (the ink supply path side in one embodiment) is beyond the edge of the first electrode 60. This end of the first electrode 60 is therefore covered with the piezoelectric layer 70. The other end of the piezoelectric layer 70 in the second direction Y of the pressure chamber 12 is within the edge of the first electrode 60 (i.e., closer to the pressure chamber 12) as illustrated in FIG. 3A.

The portion of the first electrode 60 extending beyond the edge of the piezoelectric layer 70 is coupled to a lead electrode 90 (e.g., FIG. 2A) made of gold (Au) or a similar material. The lead electrode 90 serves as a terminal for coupling with wiring leading to a driver and other components.

The piezoelectric layer 70 also has depressions 71 facing the walls 11 as shown, for example, in FIGS. 1 and 2A. The width of each depression 71 in first direction X is substantially equal to or larger than the width of each wall 11 in first direction X. This ensures moderate rigidity of the diaphragm 50 in the portions facing the lateral ends of the pressure chambers 12 (the "arms" of the diaphragm 50), thereby allowing the piezoelectric elements 300 to be smoothly displaced.

The piezoelectric layer 70 can be a perovskite-structured crystal film (a perovskite crystal) made of a ferroelectric ceramic material to serve as an electromechanical transducer on the first electrode 60. Examples of materials that can be used to make the piezoelectric layer 70 include those that contain lead (Pb), titanium (Ti), and zirconium (Zr), e.g., ferroelectric piezoelectric materials such as lead zirconate titanate (PZT) and derivatives containing a metal oxide, such as niobium oxide, nickel oxide, or magnesium oxide. Specific examples include lead titanate ($PbTiO_3$), lead zirconate titanate ($Pb(Zr, Ti)O_3$), lead zirconate ($PbZrO_3$), lead lanthanum zirconate ($(Pb, La)TiO_3$), lead lanthanum zirconate titanate ($(Pb, La)(Zr, Ti)O_3$), and lead zirconium titanate magnesium niobate ($Pb(Zr, Ti)(Mg, Nb)O_3$). The piezoelectric layer 70 in one embodiment is made of lead zirconate titanate (PZT).

As is described in more detail below, the piezoelectric layer 70 can be formed by various methods including liquid-phase techniques such as the sol-gel process and MOD (metal-organic decomposition) as well as PVD (physical vapor deposition) techniques (gas-phase processes) such as sputtering and laser abrasion. The piezoelectric layer 70 in one embodiment is formed with tensile stress therein.

The second electrode 80 is formed on the surface of the piezoelectric layer 70 opposite the first electrode 60 and serves as a common electrode for several active sections 310. The second electrode 80 in one embodiment includes a first layer 81 on the piezoelectric layer 70 side and a second layer 82 on the surface of the first layer 81 opposite the piezoelectric layer 70. As described in more detail below, the first layer 81 may be, for example, produced by forming an iridium layer (a layer of iridium) on the piezoelectric layer 70, forming a titanium layer (a layer of titanium) on the iridium layer, and then oxidizing these layers by heating. Therefore, the first layer 81 may contain iridium oxide and titanium oxide. The iridium layer in the first layer 81 also serves as an anti-diffusion layer, ensuring moderate diffusion of the constituents of the piezoelectric layer 70 into the first layer 81 during heat treatment and limiting diffusion of the constituents of the titanium layer into the piezoelectric layer 70.

The titanium layer in the first layer 81 adsorbs any surplus surface constituents (on the second electrode 80 side) of the piezoelectric layer 70, e.g., an excess of lead on the surface of the piezoelectric layer 70 when the piezoelectric layer 70 contains lead, thereby improving the piezoelectric properties of the piezoelectric layer 70.

The second layer 82 of the second electrode 80 is made of a conductive material. For example, the second layer 82 can be made of iridium, and can also be a stack of titanium and iridium. The second layer 82 is thicker than the first layer 81 in order that the electrical resistance can be sufficiently low. A layer of iridium has compressive stress therein while a layer of titanium has substantially no internal stress. The second electrode 80 therefore includes compressive stress therein.

The second electrode 80 may include projections 83 sticking out of the surface opposite the piezoelectric layer 70. The projections 83 are aggregates of lead formed by absorption of lead (Pb) from the piezoelectric layer 70 onto titanium (Ti) in the first layer 81 The projections 83 contain iridium and titanium, i.e., materials that make up the second electrode 80 (the first layer 81), in addition to the lead in the piezoelectric layer 70. The second layer 82 is formed on the first layer 81 to follow the shape of the projections 83. As a result, the projections 83 appear on the surface of the second electrode 80 (on the side opposite the piezoelectric layer 70).

Such projections 83 each have dimensions of equal to or less than 500 nm in the plane directions (first direction X and second direction Y) and 20 nm to 50 nm, both inclusive, in the height direction (the direction in which the piezoelectric layer 70 and the second electrode 80 are stacked). As is described in more detail below, the size of the projections 83 depends on heating conditions such as temperature and duration and the size of the projections 83 generally increases with increasing heating temperature.

Either end of the second electrode 80 in the second direction Y of the pressure chamber 12 (the ink supply path side) is within the edge of the piezoelectric layer 70 (i.e., closer to the pressure chamber 12). One end of the piezoelectric layer 70 in second direction Y is therefore beyond the edge of the second electrode 80.

With such a structure, each piezoelectric element 300 is displaced when voltage is applied across the first electrode 60 and the second electrode 80. In other words, applying voltage across the first and second electrodes induces piezoelectric strain on the piezoelectric layer 70 in the section where the piezoelectric layer 70 is sandwiched between the first electrode 60 and the second electrode 80. The section where the piezoelectric layer 70 undergoes piezoelectric strain when voltage is applied across the two electrodes is referred to as an active section 310. The section where the piezoelectric layer 70 does not undergo piezoelectric strain is referred to as an inactive section 320. The active section 310, in which the piezoelectric layer 70 undergoes piezoelectric strain, includes a flexible portion that faces the pressure chamber 12 and an inflexible portion that extends outside the edge of the pressure chamber 12.

In one embodiment, the first electrode 60, the piezoelectric layer 70, and the second electrode 80 all extend continuously beyond the edge of the pressure chamber 12 in the second direction Y of the pressure chamber 12. Thus, the active section 310 extends continuously beyond the edge of the pressure chamber 12. As a result, the active section 310 is flexible in the portion where the piezoelectric element 300 faces the pressure chamber 12, and is inflexible in the portion extending outside the edge of the pressure chamber 12.

In one embodiment, the ends of the active section 310 in second direction Y are defined by the second electrode 80 as illustrated in FIG. 3A. Furthermore, the ends of the active section 310 in second direction Y are beyond the area facing the pressure chamber 12, i.e., located in the inflexible portion.

An inactive section 320, the section the second electrode 80 does not reach, extends outside the active section 310 in second direction Y, on the side opposite the ink supply paths 13 in one embodiment. The inactive section 320 is thinner than the active section 310 in the second direction Y. Thus, a difference in height exists between the active section 310 and the inactive section 320 because of the difference in thickness. This difference in height is provided by a slope 330, which is a surface inclined with respect to the direction perpendicular to the surface of the flow channel substrate 10 on which the piezoelectric element 300 is disposed (i.e., sloping in relation to the normal direction). The thickness of the active section 310 or the inactive section 320 is the total thickness of the first electrode 60, the piezoelectric layer 70, and the second electrode 80 in the direction of stacking.

Providing the slope 330 helps to prevent stress from concentrating at the corner between the slope 330 and the surface of the inactive section 320, thereby reducing the damage associated with stress concentration at this corner.

The slope 330 may be at an angle of 10 to 45 degrees with respect to the surface of the active section 310. This is because, for example, increasing the angle of the slope 330 beyond 45 degrees and near to the vertical causes stress to concentrate at the corner between the slope 330 and the inactive section 320, resulting in cracks and other sorts of damage occurring at the corner between the slope 330 and the inactive section 320.

In the piezoelectric element 300, the second electrode 80 covers the piezoelectric layer 70, so that no current leakage occurs between the first electrode 60 and the second electrode 80. As a result, damage to the piezoelectric layer 300 is limited. If the first electrode 60 and the second electrode 80 were exposed in close vicinity of each other, leakage currents would flow on the surface of the piezoelectric layer 70 and break the piezoelectric layer 70. Providing a sufficient distance between the first electrode 60 and the second electrode 80 avoids any current leakage, even when the two electrodes are exposed.

For the flow channel substrate 10 that includes piezoelectric elements 300 thereon, a protective substrate 30 configured for protecting the piezoelectric elements 300 is bonded with an adhesive agent 35 as illustrated in FIG. 1 and FIGS. 2A and 2B.

The protective substrate 30 includes a piezoelectric element housing 31, which is a recess that defines a space to accommodate the piezoelectric elements 300. The protective substrate 30 also includes a manifold portion 32 that is a component of the manifold 100. The manifold portion 32 extends through the entire thickness of the protective substrate 30 and along the direction of the width of the pressure chambers 12. As mentioned above, the manifold portion 32 communicates with the communicating space 15 of the flow channel substrate 10. The protective substrate 30 also has a through-hole 33 that extends through the entire thickness of the protective substrate 30. The lead electrode 90 coupled to the first electrode 60 of each active section 310 is exposed in the through-hole 33, and an end of wiring that leads to a driver (not illustrated) is coupled to the lead electrode 90 in the through-hole 33.

Bonding the protective substrate 30 in a certain area where the piezoelectric layer 70 and the second electrode 80 exist improves adhesion via the anchor effect because the second electrode 80 includes the projections 83.

A compliance substrate 40 that has a sealing film 41 and a stationary plate 42 is bonded to the protective substrate 30. The sealing film 41 is made of a low-rigidity flexible material, and either side of the manifold portion 32 is sealed with the sealing film 41. The stationary plate 42 is made of a hard material, such as metal. The area of the stationary plate 42 facing the manifold 100 is an opening 43 that extends through the entire thickness of the stationary plate 42. One side of the manifold 100 is therefore sealed with the flexible sealing film 41 only.

The ink jet recording head I receives ink via an ink inlet connected with an external ink source (not illustrated), fills the entire internal space from the manifold 100 to the nozzle openings 21 with the ink, and then, in response to recording signals transmitted from a driver, distributes voltage between the pieces of the first electrode 60 for the individual pressure chambers 12 and the second electrode 80. The voltages cause the piezoelectric elements 300 and the diaphragm 50 to undergo flexural deformation. As a result, the pressure chambers 12 are pressurized and droplets of the ink are ejected through the nozzle openings 21.

The following discussion describes a method for manufacturing an ink jet recording head according to this embodiment. FIGS. 4A and 4B, 5A to 5D, 6A and 6B, 8A and 8B, and 9A to 9C are cross-sectional diagrams illustrating an example of a method for manufacturing an ink jet recording head.

Figure 4A:
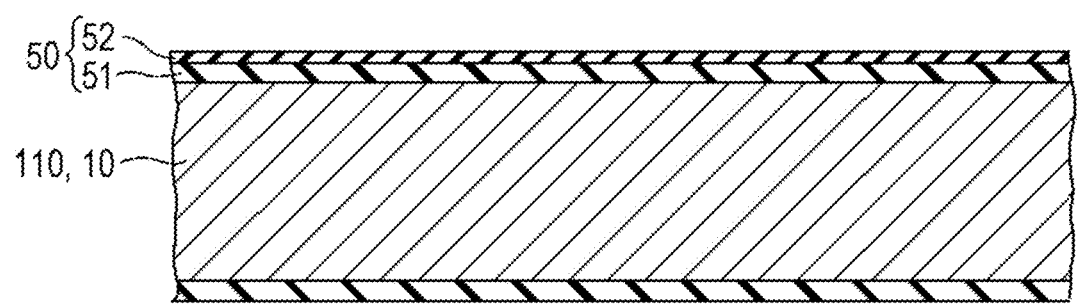
FIGS. 4A and 4B, 5A to 5D, 6A and 6B, 8A and 8B, and 9A to 9C are cross-sectional diagrams illustrating a method for manufacturing the recording head.

First, a diaphragm 50 is formed on the surface of a flow channel substrate wafer 110 (e.g., a silicon wafer) as illustrated in FIG. 4A. In one embodiment, the flow channel substrate wafer 110 is thermally oxidized to form a coating of silicon dioxide (an elastic film 51), and a layer of zirconium oxide is deposited by sputtering and then thermally oxidized (an insulating film 52) to form the diaphragm 50.

The diaphragm 50 (the layer on the electrode side for a multilayer diaphragm) should be an insulating material that withstands the temperature at which the piezoelectric layer 70 is formed (usually 500° C. or more). When a silicon wafer is used as the base for flow channel substrates 10 and the flow channel (the pressure chambers 12 etc.) is created by anisotropic etching with KOH (potassium hydroxide), the diaphragm 50 (the layer on the silicon wafer side for a multilayer diaphragm) serves as an etching-stopping layer. Furthermore, when the diaphragm 50 contains some percent silicon dioxide, diffusion of the constituents of the piezoelectric layer 70, such as lead and bismuth, alters the silicon dioxide and causes the upper electrodes and the piezoelectric layer 70 to detach. In such a case an anti-diffusion layer that prevents diffusion into the silicon dioxide may also be needed.

A diaphragm 50 produced by stacking a layer of silicon dioxide and a layer of zirconium oxide is used because each material withstands the temperature at which the piezoelectric layer 70 is formed and because the silicon dioxide layer performs the functions of an insulating layer and an etching-stopping layer while the zirconium oxide layer performs the functions of an insulating layer and an anti-diffusion layer. Although the diaphragm 50 may be composed of the elastic film 51 and the insulating film 52, the diaphragm 50 may be formed from either the elastic film 51 or the insulating film 52 alone.

Figure 4B:
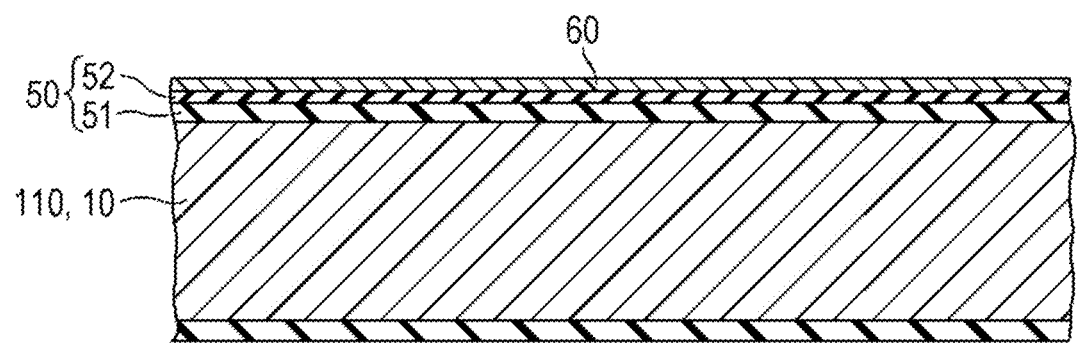

A first electrode 60 is then formed over the diaphragm 50 as illustrated in FIG. 4B. The first electrode 60 can be made of any material as long as the material maintains conductivity when, for example, oxidized during the heat treatment to form the piezoelectric layer 70 (usually at 500° C. or more) or contaminated by diffusion of materials out of the piezoelectric layer 70. Examples of materials for the first electrode 60 therefore include metals such as platinum and iridium and conductive oxides such as iridium oxide and lanthanum nickel oxide. The first electrode 60 may include a stack of such materials, because such materials maintain conductivity even at high temperatures. The first electrode 60 can be formed by various methods including gas-phase film formation techniques such as sputtering, PVD (physical vapor deposition), and laser abrasion as well as liquid-phase techniques such as spin coating. An adhesion layer may be provided between the conductive material and the diaphragm 50 to ensure sufficient adhesion. The adhesion layer may be made of titanium (not illustrated). The adhesion layer can be made of materials such as zirconium, titanium, and titanium oxide. Examples of methods that can be used to form the adhesion layer are similar to those listed for the first electrode 60.

The surface of the first electrode 60 (on the piezoelectric layer 70 side) may be coated with an orientation control layer that controls the crystal growth in the piezoelectric layer 70. In one embodiment, a layer of titanium is used to control the crystal growth in the piezoelectric layer 70 (PZT). The layer of titanium infiltrates into the piezoelectric layer 70 while the piezoelectric layer 70 is formed and thus leaves no residual film after the piezoelectric layer 70 is completed. The orientation control layer can also be made of perovskite-structured conductive oxides such as lanthanum nickel oxide. Examples of methods that can be used to form the orientation control layer are similar to those listed for the first electrode 60.

It is desirable that no residual insulating orientation control film exist between the piezoelectric layer 70 and the first electrode 60 after the piezoelectric layer 70 is formed. This is because a series connection of capacitors formed by the orientation control layer and the piezoelectric layer 70 would weaken the electric field applied to the piezoelectric layer 70. One embodiment uses an orientation control layer made of titanium. The titanium infiltrates into the piezoelectric layer 70, rather than being oxidized (turning into an insulating material), while being heated and leaves no residual film.

A piezoelectric layer 70 made of lead zirconate titanate (PZT) (or other suitable material) is then formed. The piezoelectric layer 70 may be formed by the sol-gel process, in which a metal complex is dissolved or dispersed in a solvent to form "sol", the sol is applied and dried into gel, and the gel is fired at a high temperature to provide a piezoelectric layer 70 made of a metal oxide. The piezoelectric layer 70 can also be produced by methods other than the sol-gel process, including MOD (metal-organic decomposition) and PVD (physical vapor deposition) techniques such as sputtering and laser abrasion. Therefore both liquid-phase techniques and gas-phase techniques can be used to form the piezoelectric layer 70.

Figure 5A:
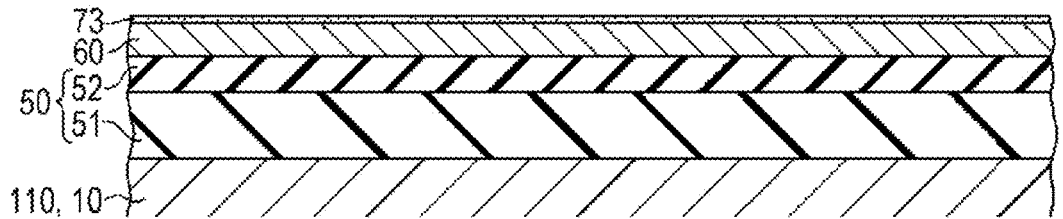

The following is a specific process for forming the piezoelectric layer 70. First, a precursor piezoelectric coating 73 made of a precursor material to PZT is formed on the first electrode 60 as illustrated in FIG. 5A. More specifically, a sol (or a solution) that contains a metal complex is applied to the flow channel substrate wafer 110 with the first electrode 60 (and a seed crystal layer not illustrated) thereon (application stage). The precursor piezoelectric coating 73 is then heated to a predetermined temperature and dried for a certain period of time (drying stage). In this embodiment, for example, the precursor piezoelectric coating 73 can be kept at 170° C. to 180° C. for 8 to 30 minutes to dry.

The dried precursor piezoelectric coating 73 is then heated to a predetermined temperature and kept at that temperature for a certain period of time (degreasing stage) to be degreased. In one embodiment, for example, the precursor piezoelectric coating 73 is heated to a temperature on the order of 300° C. to 400° C. and kept at that temperature for about 10 to 30 minutes to be degreased. The term degreasing, as used herein, represents inducing the organic substances in the precursor piezoelectric coating 73 to leave in the form of $NO_2$, $CO_2$, $H_2O$, or similar species.

Figure 5B:
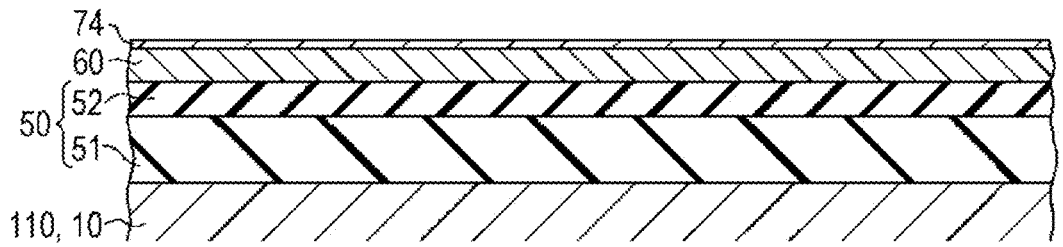

The precursor piezoelectric coating 73 is then heated to a predetermined temperature and kept at that temperature for a certain period of time to crystallize into a piezoelectric film 74 as illustrated in FIG. 5B (firing stage). During the firing stage the degreased piezoelectric coating 73 may be heated to at least 700° C. At the firing stage the rate of temperature increase is preferably 50° C./sec or more. This results in a piezoelectric film 74 that has excellent characteristics.

Examples of heaters that can be used in such drying, degreasing, and firing stages include a hot plate and RTP (rapid thermal processing) systems, which use infrared lamps to heat the object.

Figure 5C:
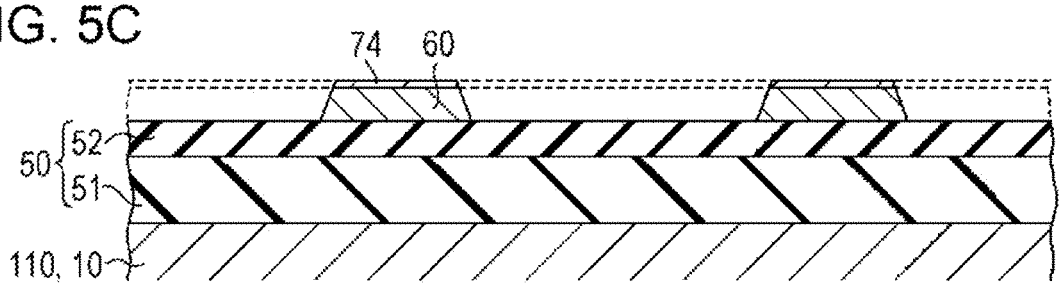

After the first piezoelectric film 74 is formed on the first electrode 60, the first electrode 60 and the first piezoelectric film 74 are simultaneously patterned to have sloping sides as illustrated in FIG. 5C. Examples of methods that can be used to pattern the first electrode 60 and the first piezoelectric film 74 include dry etching processes such as reactive ion etching (RIE) and ion milling.

Patterning the first electrode 60 before forming the first piezoelectric film 74, for example, would alter the surface of the first electrode 60 and the upper components such as the seed crystal layer made of titanium or a similar material (not illustrated) because the first electrode 60 would be patterned by a process including photographic operations, ion milling, and asking. Forming the piezoelectric film 74 on the altered surface would affect the crystallinity of the resulting piezoelectric film 74, and the resulting poor crystallinity of the first piezoelectric film 74 would affect the crystals that grow to form the second and subsequent piezoelectric films 74. Therefore the resulting piezoelectric layer 70 would also have insufficient crystallinity.

In contrast, the approach of forming the first piezoelectric film 74 first and then patterning simultaneously with the first electrode 60 does not greatly affect the crystal growth in the second and subsequent piezoelectric films 74, even if the patterning process produces a very thin altered surface layer, because the first piezoelectric film 74 provides an effective seed layer for the crystals that form the second and subsequent piezoelectric films 74 to grow well, compared to seed crystals made of titanium or a similar material.

Before the second piezoelectric film 74 is formed, an orientation control layer (an intermediate orientation control layer) may be provided on the exposed diaphragm 50 (in this embodiment, the zirconium oxide insulating film 52). In one example, the intermediate orientation control layer may be made of titanium. This titanium-made intermediate orientation control layer, like the titanium in the orientation control layer on the first electrode 60, infiltrates into the piezoelectric film 74 while the piezoelectric film 74 is formed. It should be noted that the use of such an intermediate orientation control layer may lead to poor piezoelectric properties when the control layer acts as an intermediate electrode or a dielectric material in a series connection of capacitors. As such, the intermediate orientation control layer is desirably made of a material that infiltrates into the piezoelectric film 74 (piezoelectric layer 70) and leaves no residual film after the piezoelectric layer 70 is completed.

Figure 5D:
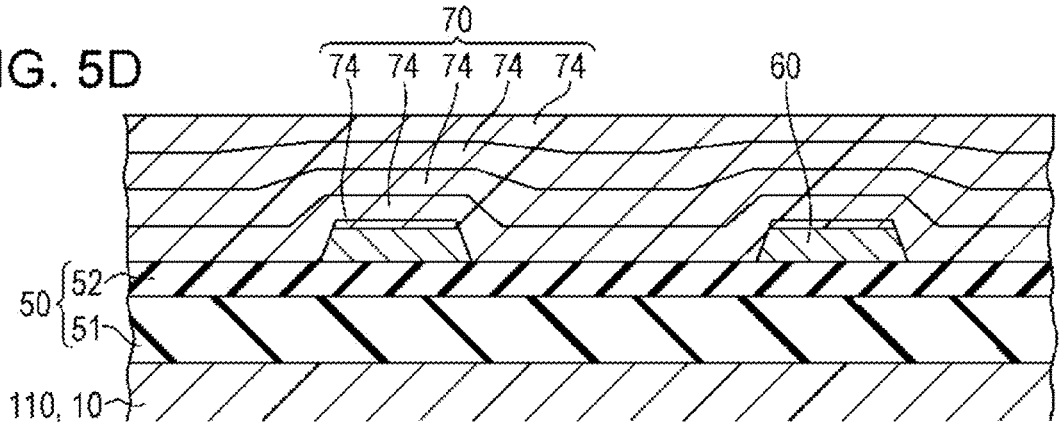

The above piezoelectric film formation process, including application, drying, degreasing, and firing stages, is then repeated for several cycles. In this manner, several piezoelectric films 74 are stacked to form the piezoelectric layer 70 as illustrated in FIG. 5D.

Figure 6A:
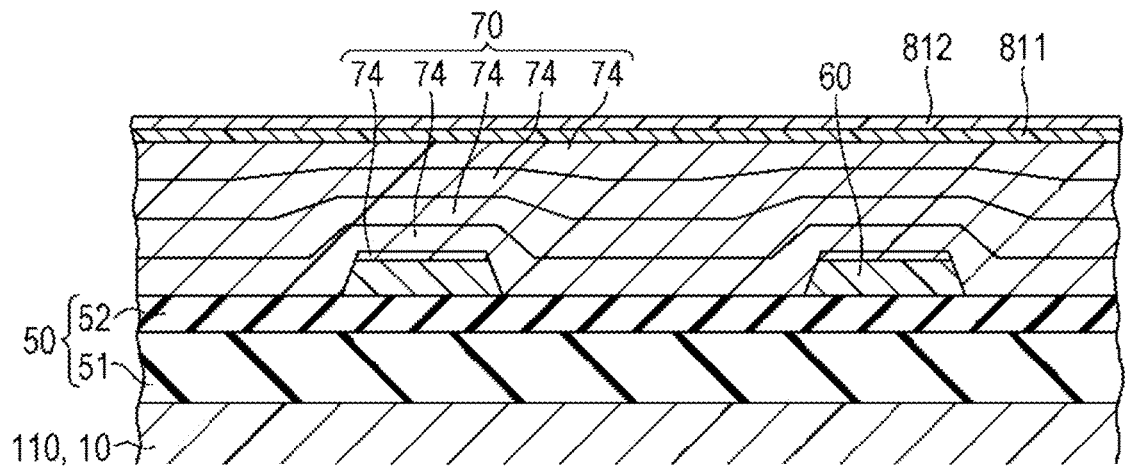

Then, as illustrated in FIG. 6A, an iridium layer 811 that contains iridium is deposited on the piezoelectric layer 70, and a titanium layer 812 that contains titanium is deposited on the iridium layer 811. The iridium layer 811 and the titanium layer 812 can be formed by sputtering or CVD, for example.

Figure 6B:
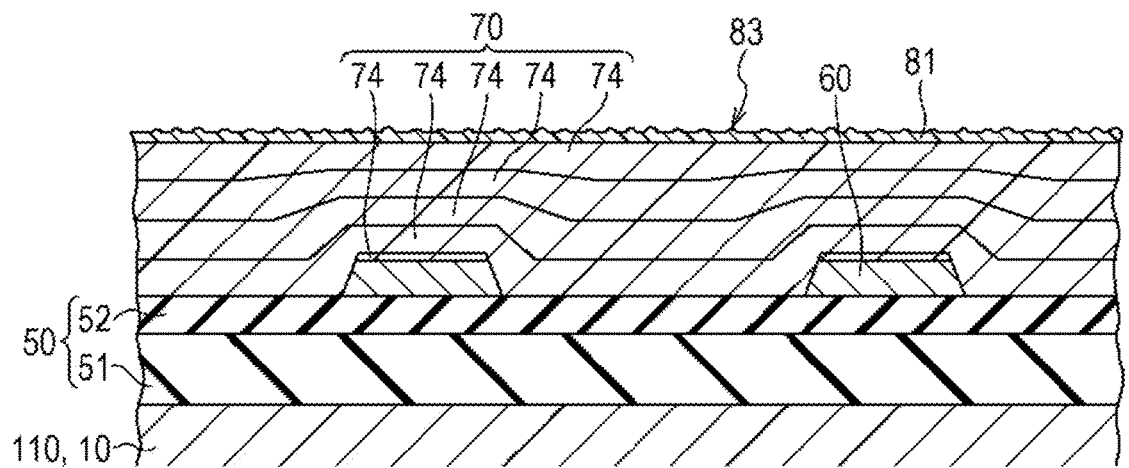

The piezoelectric layer 70 is then heated with the iridium layer 811 and the titanium layer 812 thereon (post-annealing) as illustrated in FIG. 6B. Such a post-annealing process oxidizes the iridium layer 811 and the titanium layer 812, and results in a first layer 81 that contains iridium oxide and titanium oxide. Even if forming the iridium layer 811 and other layers on the second electrode 80 side of the piezoelectric layer 70 causes damage, the post-annealing process repairs the damage to the piezoelectric layer 70 and improves the piezoelectric properties of the piezoelectric layer 70. Furthermore, post-annealing makes an excess of lead existing on the second electrode 80 side of the piezoelectric layer 70 adsorbed to the adjacent layer. The adsorption limits the negative impact of the surplus lead on the piezoelectric properties of the piezoelectric layer 70. This process of adsorption of lead from the piezoelectric layer 70 to the first layer 81 also forms several projections 83 that are aggregates of lead. The projections 83 stick out of the surface of the first layer 81 opposite the piezoelectric layer 70. Therefore the projections 83 are made of the materials that make up the first layer 81, i.e., iridium (the iridium layer 811) and titanium (the titanium layer 812), and the lead originating in the piezoelectric layer 70.

The temperature for the post-annealing process may be in the range of −10° C. to +50° C., both inclusive, with respect to the temperature of the firing process to form the piezoelectric films 74 (the temperature at which the precursor piezoelectric coatings 73 are heated for crystallization). The size of the projections 83 generally increases with increasing post-annealing temperature. In one embodiment, the above condition, i.e., a temperature of −10° C. to +50° C., both inclusive, with respect to the temperature of the firing process to form the piezoelectric films 74, results in the projections 83 whose dimensions are equal to or less than 500 nm in the plane directions (first direction X and second direction Y) and 20 nm to 50 nm, both inclusive, in the height direction (the direction in which the piezoelectric layer 70 and the second electrode 80 are stacked).

Figure 7:
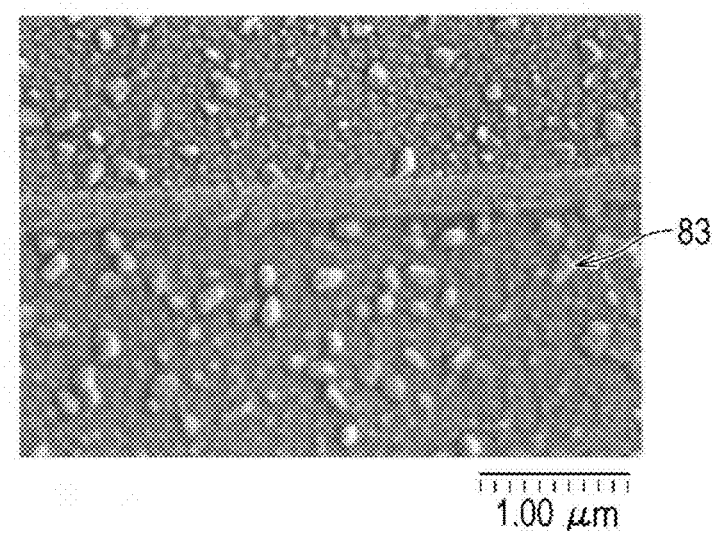
FIG. 7 is an SEM image of a first layer formed in a piezoelectric element in the recording head.

A piezoelectric layer 70, an iridium layer 811, and a titanium layer 812 were heated at 740° C. for 8 minutes for post-annealing purposes in accordance with one embodiment. FIG. 7 shows a scanning-electron microscopic (SEM) observation of the surface of the resulting first layer 81.

Separately, a study was conducted to determine the influence of the post-annealing temperature on the formation of the projections 83 and the withstand voltage of the piezoelectric elements 300. The results are summarized in the Table below. The piezoelectric elements 300 were tested with the later process for forming a second layer 82 finished, and the temperature of the firing process to form the piezoelectric layer 70 was 747° C. The withstand voltage of the piezoelectric elements 300 was measured as the voltage at which 50 percent of the piezoelectric elements 300 broke. The direction of drive was chosen so that the first electrode 60 would be the positive electrode (+) whereas the second electrode 80 would be ground (GND).

TABLE

| Post-annealing temperature (° C.) | Projections | Withstand voltage (V) |
| --- | --- | --- |
| No post-annealing | Not formed | Approx. 80 V |
| 700° C. | Not formed | Approx. 80 V |
| 740° C. | Formed | 125 V |
| 770° C. | Formed | 125 V |
| 800° C. | Formed | 115 V |

As shown in the Table, post-annealing at 740° C. to 800° C. improves the withstand voltage, compared to the case where post-annealing is not performed. In particular, post-annealing at a temperature of 740° C. to 770° C., both inclusive, provides piezoelectric elements 300 that have an excellent withstand voltage. Post-annealing at too low of a temperature does not improve the withstand voltage because the surplus lead is not adsorbed. Increasing the post-annealing temperature too high would not provide a significant improvement in withstand voltage because the first layer 81 would adsorb more lead out of the piezoelectric layer 70 than necessary, causing a lack of lead in the piezoelectric layer 70.

Figure 8A:
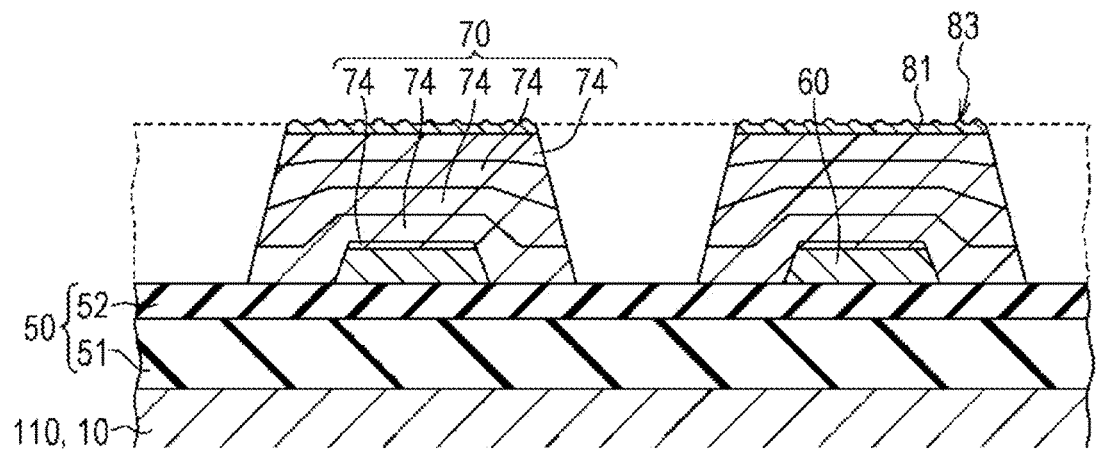

The first layer 81 and the piezoelectric layer 70 are then patterned such that the elements correspond to pressure chambers 12 as illustrated in FIG. 8A. In this embodiment these layers are patterned by photolithography, or more specifically by placing a patterned mask (not illustrated) on the first layer 81 and etching the piezoelectric layer 70 through the mask. Examples of methods that can be used to pattern the piezoelectric layer 70 include dry etching processes such as reactive ion etching and ion milling.

In one embodiment, post-annealing is performed after the first layer 81 is formed and before the first layer 81 and the piezoelectric layer 70 are patterned. This is not the only possible order. It is also possible to form the iridium layer 811 and the titanium layer 812 that make up the first layer 81, pattern the piezoelectric layer 70 together with the iridium layer 811 and the titanium layer 811, and then perform post-annealing.

Figure 8B:
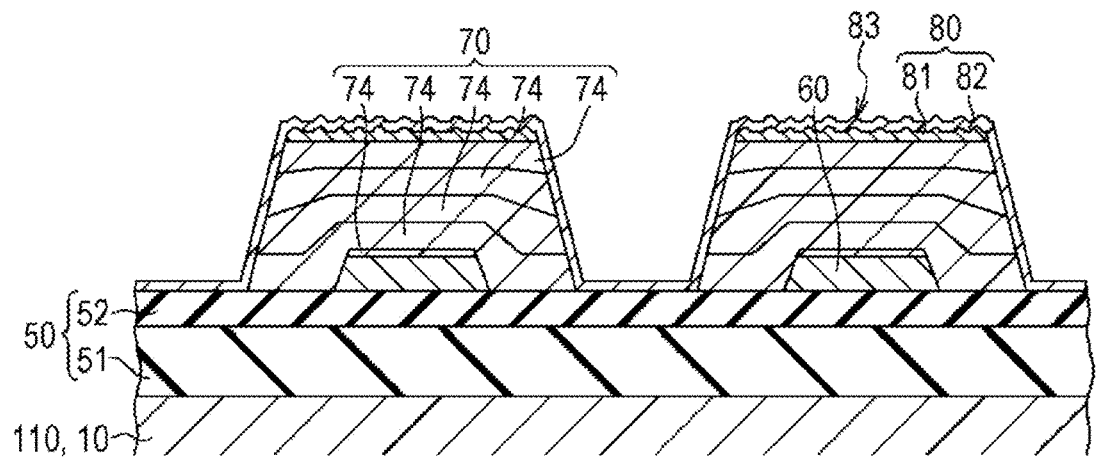

Then, as illustrated in FIG. 8B, a second layer 82 made of iridium (Ir) or a similar material, is formed over the first layer 81, the sides of the patterned piezoelectric layer 70, and the insulating film 52 to form a second electrode 80. The second electrode 80 is patterned. This process forms active sections 310 and inactive sections 320 and etches away some of the piezoelectric layer 70 in the direction of thickness to make slopes 330 (see FIGS. 3A and 3B). The second layer 82 is formed to follow the shape of the surface of the first layer 81. As a result, projections 83 appear on the surface of the second layer 82.

Although not illustrated, lead electrodes 90 are then formed and patterned (see FIGS. 2A and 2B).

Figure 9A:
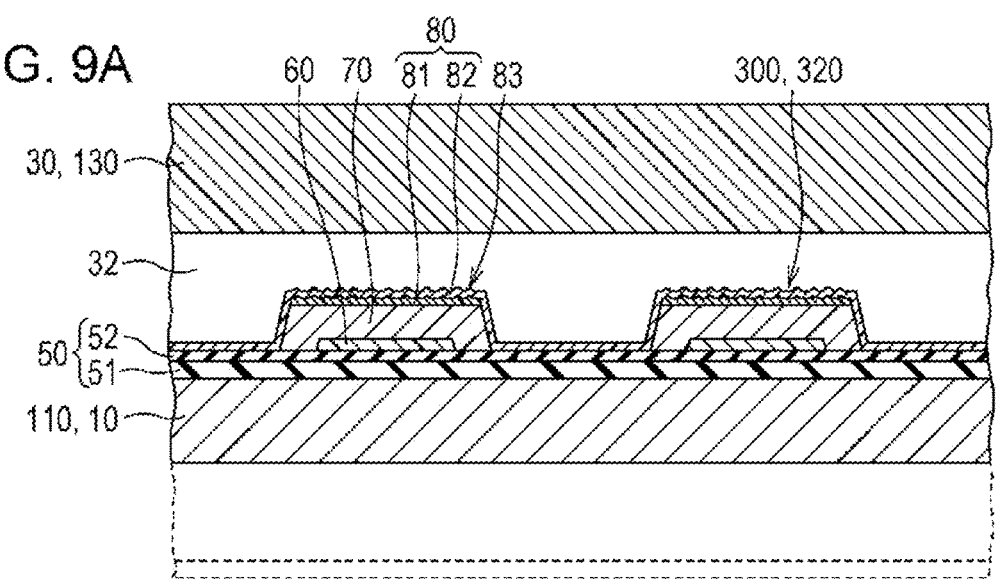

Then, as illustrated in FIG. 9A, a protective substrate wafer 130 (e.g., a silicon wafer) as the base for several protective substrates 30 is bonded using an adhesive agent 35 (see FIGS. 2A and 2B) to the piezoelectric element 300 side of the flow channel substrate wafer 110, and the flow channel substrate wafer 110 is thinned to a predetermined thickness.

Figure 9B:
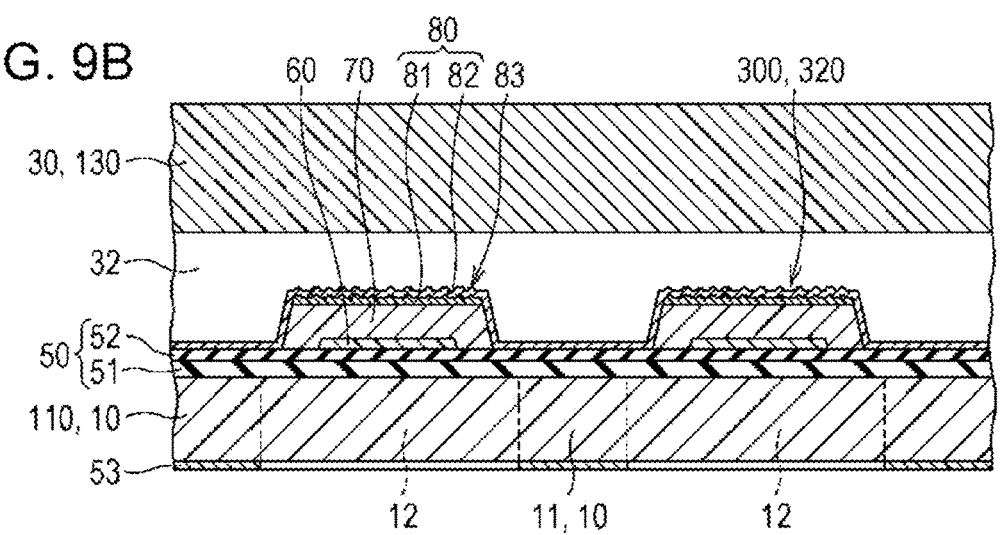
Figure 9C:
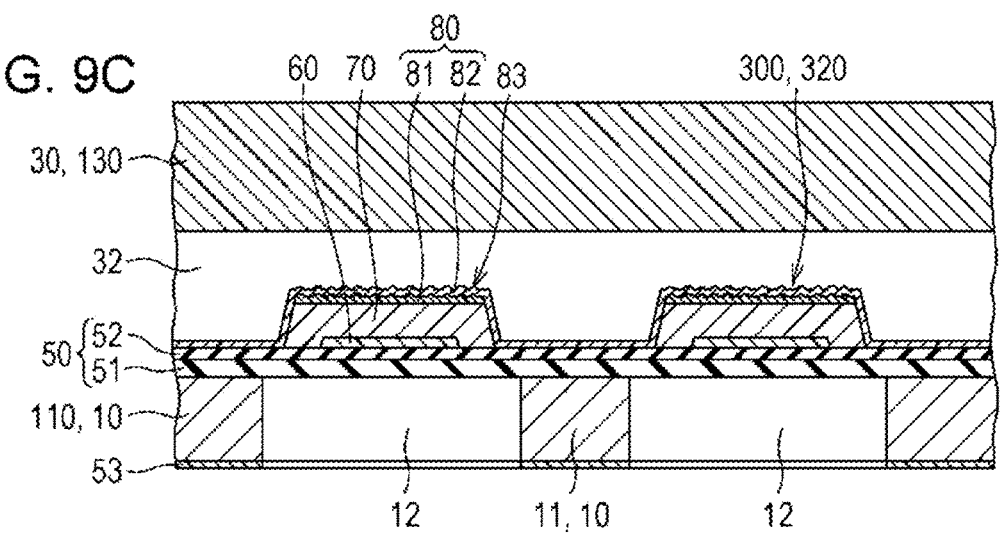

A mask coating 53 is then formed and patterned on the flow channel substrate wafer 110 as illustrated in FIG. 9B. The flow channel substrate wafer 110 is then anisotropically etched with a solution of KOH or a similar alkali (wet etching) through the mask coating 53 as illustrated in FIG. 9C. As a result, the pressure chambers 12 for the individual piezoelectric elements 300 are created along with ink supply paths 13, communicating paths 14, a communicating space 15, and other features.

The flow channel substrate wafer 110 and the protective substrate wafer 130 are then trimmed by cutting off unnecessary edges by dicing or similar techniques. A nozzle plate 20 drilled with nozzle openings 21 is then bonded to the surface of the flow channel substrate wafer 110 opposite the protective substrate wafer 130, and compliance substrates 40 are bonded to the protective substrate wafer 130. The entire structure including the flow channel substrate wafer 110 and all other components is divided into equal-sized chips each composed of one flow channel substrate 10 and other components like the article illustrated in FIG. 1, providing ink jet recording heads according to embodiments of the invention.

Other Embodiments

The above-described embodiment of the invention is not the only possible basic structure and configuration of that aspect of the invention.

For example, although the above embodiment illustrates a structure in which the active sections 310 share a continuous piezoelectric layer 70, separate piezoelectric layers 70 may be provided for the individual active sections 310. Likewise, although the second electrode 80 serves as a common electrode for more than one active section 310 and the first electrode 60 provides separate electrodes for the individual active sections 310, this is not the only choice. For example, the first electrode 60 may serve as a common electrode for more than one active section 310, and the second electrode 80 may provide separate electrodes for the individual active sections 310. Such a structure, in which the first electrode 60 serves as a common electrode for more than one active section 310, means that the first electrode 60 extends over more than one active section 310. This allows, for example, the elastic film 51 and the insulating film 52 to be omitted and the first electrode 60 to serve as a diaphragm in one example. Furthermore, each piezoelectric element 300 may substantially serve as a diaphragm, regardless of whether the first electrode 60 provides separate electrodes as in the above embodiment or the first electrode 60 serves as a common electrode. When the first electrode 60 is formed directly on the flow channel substrate 10, however, the first electrode 60 may be protected with an insulating protective film or a similar material to prevent electricity from flowing from the first electrode 60 to the ink. When it is herein stated that the first electrode 60 is formed on the substrate (flow channel substrate 10), therefore, it means that the electrode can be in direct contact with the substrate or with any other component therebeneath (i.e., the electrode can be above the substrate). Furthermore, the silicon substrate used as the base for the flow channel substrate 10 may be processed with a portion thereof reserved in such a manner that the reserved portion can serve as a diaphragm.

Although the second electrode 80 may include the first layer 81 and the second layer 82 as previously describe, this is not the only possible structure. The second electrode 80 may be a single-layer electrode or have three or more layers as long as the second electrode 80 has at least the first layer 81 that includes the projections 83.

To take another example, the piezoelectric films 74 in the above embodiments are formed one by one by applying the material for one precursor piezoelectric coating 73, drying the obtained coating, degreasing the dried coating, and then firing the degreased coating. This is not the only possible approach. For example, the piezoelectric films 74 may be formed by repeating the application, drying, and degreasing processes to form a precursor piezoelectric coating 73 for several cycles, e.g., two cycles, and then firing the degreased coatings together.

Figure 10:
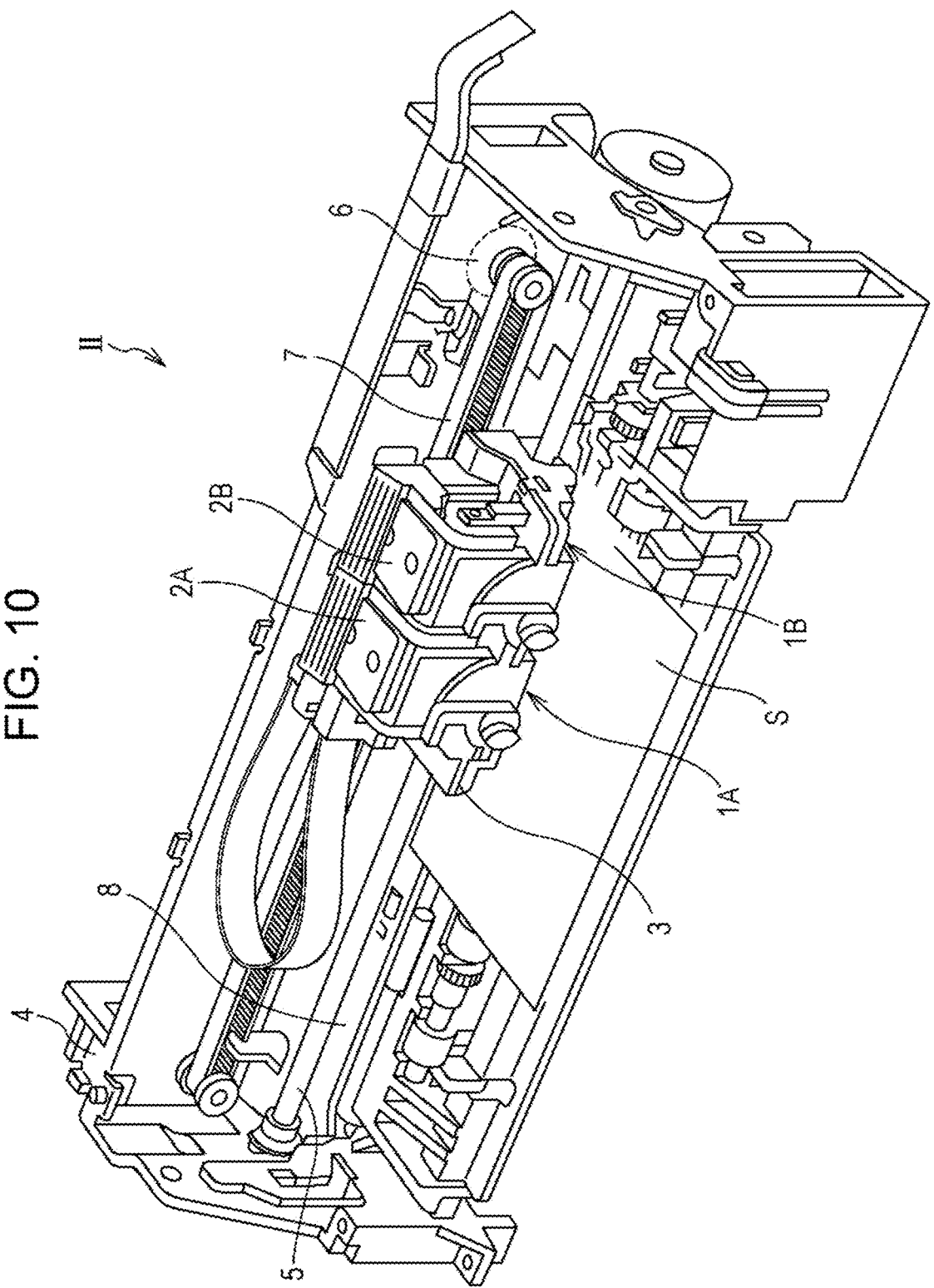
FIG. 10 is a schematic view of an example of a liquid ejecting apparatus

As illustrated in FIG. 10, the ink jet recording head I can be installed in an ink jet recording apparatus II, for example. The recording head units 1A and 1B, each holding the ink jet recording head I, are equipped with detachable cartridges 2A and 2B that provide ink supply means. The carriage 3, loaded with the recording head units 1A and 1B, can move along a carriage shaft 5 installed in the main body 4. The recording head units 1A and 1B eject, for example, a black ink composition and a color ink composition, respectively.

Driving force generated by a motor 6 is transmitted through gears (not illustrated) and a timing belt 7 to the carriage 3. As a result, the carriage 3 moves along the carriage shaft 5 with the recording head units 1A and 1B thereon. The main body 4 also has a platen 8 that extends along the carriage shaft 5. A recording sheet S, a sheet of paper or another recording medium, fed by a set of rollers or a similar feeding mechanism (not illustrated) is transported by the platen 8.

An aspect of embodiments of the invention limits, as described above, damage to the piezoelectric elements 300 used in the ink jet recording heads I and ensures uniform ejection properties, thereby improving the print quality and the durability of the ink jet recording apparatus II.

Although the ink jet recording heads I in the illustrated ink jet recording apparatus II move on a carriage 3 in the primary scanning direction, this is not the only possible configuration. For example, the ink jet recording apparatus II can be a line-head recording apparatus, in which the ink jet recording heads I remain in fixed positions and the recording sheet S, a sheet of paper or another recording medium, moves in the secondary scanning direction.

Furthermore, the illustrated ink jet recording apparatus II includes ink cartridges 2A and 2B as reservoirs on a carriage 3, but this is not the only possible configuration. For example, ink tanks or another reservoir may be fixed to the main body 4 and connected to the ink jet recording heads 1A and 1B via tubes or other supply piping. It is even possible that an ink jet recording apparatus has no reservoirs.

An ink jet recording head is discussed as an example of a liquid ejecting head to describe one or more aspects of embodiments of the invention, and these aspects can be applied to a wide range of liquid ejecting heads. Examples of suitable liquid ejecting heads include recording heads for printers and other kinds of image recording apparatus, colorant ejecting heads for manufacturing color filters for liquid crystal displays and other kinds of displays, electrode material ejecting heads for forming electrodes for organic EL displays, FEDs (field emission displays), and other kinds of displays, and bioorganic substance ejecting heads for manufacturing biochips.

Furthermore, another aspect of embodiments of the invention can be applied to actuators for all kinds of apparatus in addition to the illustrated liquid ejecting heads (ink jet recording heads). Actuators according to an aspect of the invention can be used in sensors, for example.

What is claimed is:

1. A liquid ejecting head comprising:
   a flow channel substrate, wherein the flow channel substrate includes a pressure chamber that communicates with a nozzle opening; and
   a piezoelectric element on either side of the flow channel substrate, wherein the piezoelectric element includes a first electrode, a piezoelectric layer, and a second electrode, and wherein the piezoelectric layer contains lead, titanium, and zirconium,
   wherein the second electrode includes a first layer formed on a piezoelectric layer side and a second layer formed on a side of the first layer opposite the piezoelectric layer, and
   wherein the second electrode includes a plurality of projections that are aggregates of the lead originating in the piezoelectric layer, the projections sticking out of a surface of the second electrode opposite the piezoelectric layer.

2. The liquid ejecting head according to claim 1, wherein:
   the first electrode includes a plurality of separate electrodes for a plurality of active sections, of the piezoelectric element; and
   the second electrode serves as a common electrode for the active sections.

3. A liquid ejecting apparatus comprising the liquid ejecting head according to claim 1.

4. A liquid ejecting apparatus comprising the liquid ejecting head according to claim 2.

5. A piezoelectric element comprising:
   a first electrode,
   a piezoelectric layer containing lead, titanium, and zirconium, the piezoelectric layer formed over the first electrode and
   a second electrode that is formed over the piezoelectric layer,
   wherein the second electrode includes a first layer on a piezoelectric layer side and a second layer on a side of the first layer opposite the piezoelectric layer, and wherein the second electrode includes a plurality of projections that are aggregates of the lead originating in the piezoelectric layer, the projections sticking out of a surface of the second electrode opposite the piezoelectric layer.

6. A method for manufacturing a piezoelectric element that includes a first electrode, a piezoelectric layer, and a second electrode, the piezoelectric layer containing lead, titanium, and zirconium, the method comprising:

forming a first layer configured as the second electrode on the piezoelectric layer; and forming a plurality of projections on a surface of the first layer from the lead in the piezoelectric layer by patterning and heating the piezoelectric layer and the first layer so that the lead can be adsorbed from the piezoelectric layer to the first layer.

7. The method for manufacturing a piezoelectric element according to claim 6, further comprising:

after forming the projections, producing the second electrode by forming a second layer on the first layer.

* * * * *